United States Patent [19]
Yoshikawa et al.

[11] Patent Number: 4,916,521
[45] Date of Patent: Apr. 10, 1990

[54] CONTACT PORTION OF SEMICONDUCTOR INTEGRATED CIRCUIT DEVICE

[75] Inventors: Susumu Yoshikawa; Shizuo Sawada, both of Yokohama, Japan

[73] Assignee: Kabushiki Kaisha Toshiba, Kawasaki, Japan

[21] Appl. No.: 223,971

[22] Filed: Jul. 25, 1988

[30] Foreign Application Priority Data

Aug. 20, 1987 [JP] Japan .................. 62-206813

[51] Int. Cl.$^4$ .................. H01L 23/48; H01L 29/44; H01L 29/04
[52] U.S. Cl. .................. 357/71; 357/68; 357/59
[58] Field of Search .................. 357/68, 71, 71 P

[56] References Cited

U.S. PATENT DOCUMENTS

| | | | |
|---|---|---|---|
| 3,877,051 | 4/1975 | Calhoun et al. | 357/51 |
| 4,523,216 | 6/1985 | Shiotari | 357/42 |
| 4,617,193 | 10/1986 | Wu | 357/71 |

Primary Examiner—Rolf Hille
Assistant Examiner—Robert P. Limanek
Attorney, Agent, or Firm—Finnegan, Henderson, Farabow, Garrett and Dunner

[57] ABSTRACT

A first insulation layer is formed on a semiconductor substrate, and a first conductive layer is formed on the first insulation layer. A second insulation layer is formed on the first conductive layer and the first insulation layer, and a first contact hole, having a width greater than that of the first conductive layer, is formed in the second insulation layer, at a position corresponding to the first conductive layer. A second conductive layer, having a width greater than that of the first contact hole, is formed on the second insulation layer and in the first contact hole, and is formed in contact with the upper and side surfaces of the first conductive layer located inside the second contact hole. A third insulation layer is formed on the second conductive layer and the second insulation layer, and a second contact hole, having a width less than that of the second conductive layer, is formed in the third insulation layer, at a position corresponding to the second conductive layer. A third conductive layer, having a width greater than that of the second contact hole but less than that of the second conductive layer, is formed on the third conductive layer and in the second contact hole. The first conductive layer is electrically connected to the third conductive layer.

19 Claims, 5 Drawing Sheets

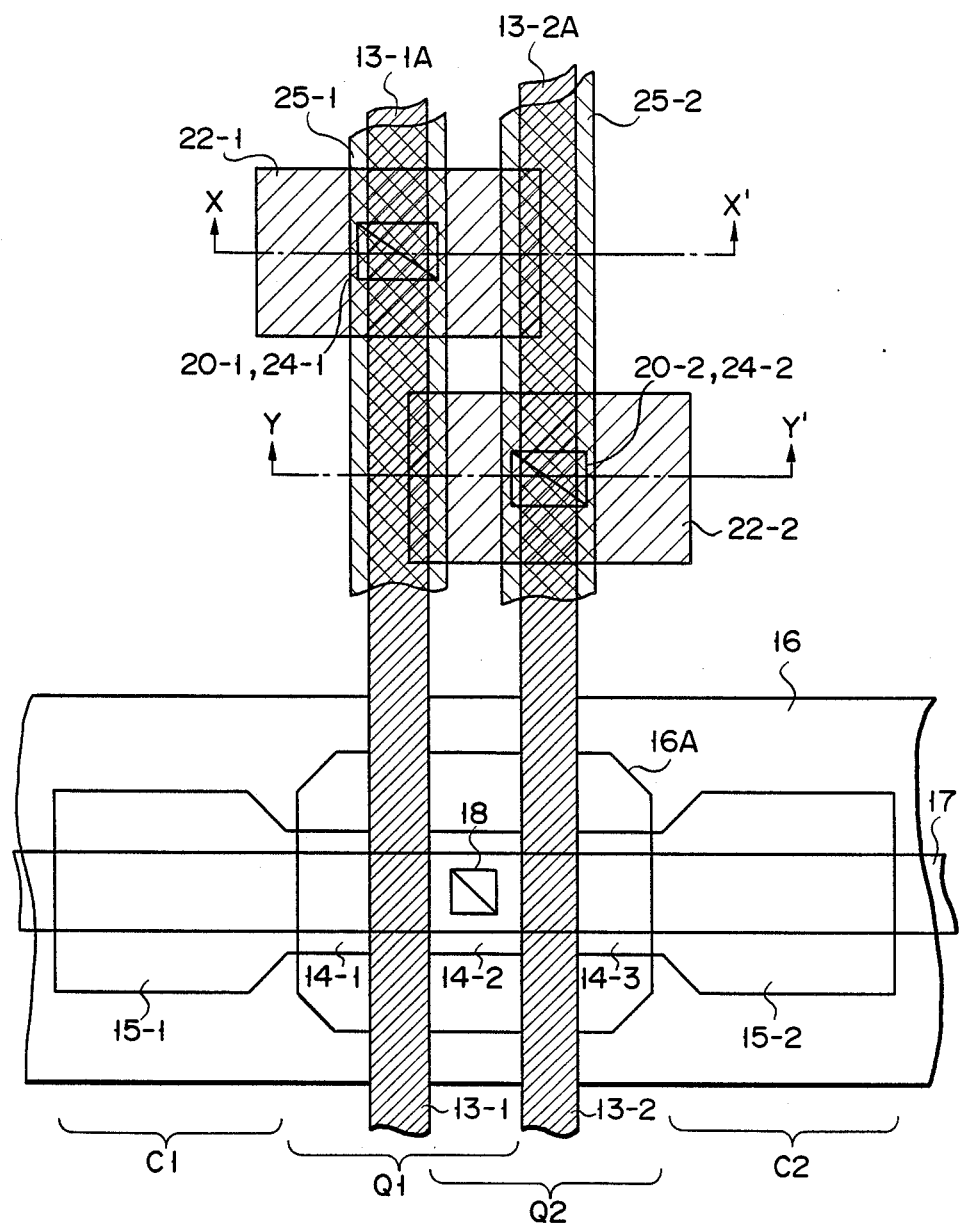
F I G. 1A

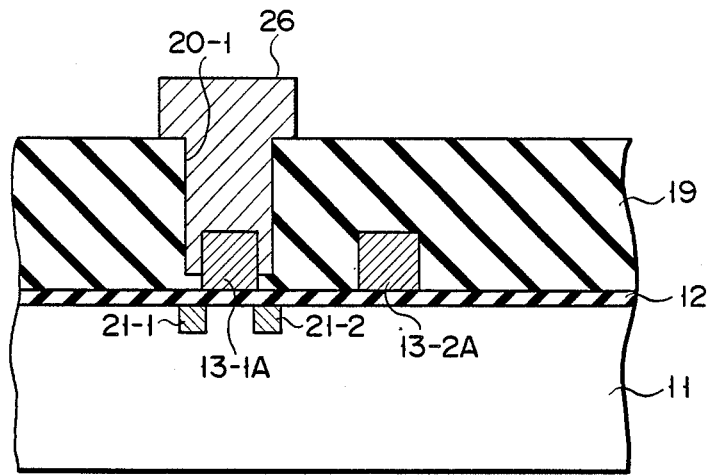
F I G. 3

CONTACT PORTION OF SEMICONDUCTOR INTEGRATED CIRCUIT DEVICE

BACKGROUND OF THE INVENTION

1. Field of the Invention

This invention relates to a semiconductor integrated circuit device and, more particularly, to a contact portion for connection between interconnection layers.

2. Description of the Related Art

In general, as the integration density of a semiconductor integrated circuit device becomes greater, the resistance of its signal transmission lines increases to thereby increase delay of a signal to be transmitted. In a semiconductor memory, for example, the gate electrodes of MOSFETs for selection (cell switching) of memory cells are extended to be used as signal lines (word lines). A polysilicon layer is generally used to form the gate electrodes. Polysilicon has a resistivity larger than metal, and therefore the wiring resistance of the signal lines increases as the integration density becomes large, thereby increasing the delay of address signals. Increase in the delay time of address signals lowers the access speed.

In order to suppress the delay of address signals to a minimum, conductive layers such as metal layers, having a lower resistivity than the signal lines (word lines) which are formed to extend from the gate electrodes of cell switching MOSFETs, are formed extending along the signal lines on an insulation film which is formed on the signal lines in the prior art. The signal line is electrically connected to the conductive layer via a contact hole or holes formed in the insulation film. Such contact portions are formed for each signal lines. Thus, the signal line having a large wiring resistance is connected in parallel with the conductive layer having a resistivity smaller than the signal line, reducing the resistance of the word lines and suppressing the delay time of address signals.

However, with the construction described above, it is necessary to make a portion of the signal line wider so as to provide a sufficiently large margin for mask alignment so that good contact between the signal line and conductive layer can always be attained. The contact may be made imperfect when, for example, masks for patterns of the contact hole and signal line are displaced from each other. For this reason, when a large number of signal lines are juxtaposed, the signal lines cannot be closely arranged because of the presence of the wide portions of the signal lines. Further, it is desired to form a large contact hole in order to reduce the contact resistance between the signal line and conductive layer. However, if the contact hole is formed larger, it is necessary to enlarge the wide portion of the signal line by the margin for mask alignment, making it necessary to increase the distance between the signal lines. This further limits the high integration density. In contrast, if the signal lines are closely formed in order to enhance the integration density, the contact resistance will increase.

As described above, the contact portion of the prior art semiconductor integrated circuit device is disadvantageous in that it is difficult to attain the high integration density when the wide portion of the signal line is provided, or the contact resistance will increase when the signal lines are closely formed to enhance the integration density.

SUMMARY OF THE INVENTION

An object of this invention is to provide a contact portion of a semiconductor integrated circuit device in which the contact resistance can be reduced without forming a wide portion in the signal line, and the signal lines can be closely arranged to attain the high integration density.

According to a first embodiment of this invention, there is provided a contact portion of a semiconductor integrated circuit device which comprises a semiconductor substrate; a first insulation layer formed on the semiconductor substrate; a first conductive layer formed on the first insulation layer; a second insulation layer formed on the first conductive layer and first insulation layer; a first contact hole having a width larger than that of the first conductive layer and formed in the second insulation layer in position corresponding to the first conductive layer; a second conductive layer having a width larger than that of the first contact hole and formed on the second insulation layer and in the first contact hole so as to be in contact with the upper and side surfaces of the first conductive layer inside the first contact hole; a third insulation layer formed on the second conductive layer and second insulation layer; a second contact hole having a width smaller than that of the second conductive layer and formed in the third insulation layer in position corresponding to the second conductive layer; and a third conductive layer formed on the third insulation layer and in the second contact hole.

According to a second embodiment of this invention, there is provided a contact portion of a semiconductor integrated circuit device which comprises a semiconductor substrate; a first insulation layer formed on the semiconductor substrate; a first conductive layer formed on the first insulation layer; a second insulation layer formed on the first conductive layer and first insulation layer; a first contact hole having a width larger than that of the first conductive layer and formed in the second insulation layer in position corresponding to the first conductive layer; a second conductive layer formed on the second insulation layer and in the first contact hole so as to be in contact with the upper and side surfaces of the first conductive layer inside the contact hole.

With the constructions of the first and second embodiments, since the second conductive layer is formed in contact with the upper and side surfaces of the first conductive layer, a sufficiently large contact area can be obtained without forming a wide portion in the first conductive layer, and the contact resistance can be reduced. The margin or tolerance of mask alignment for the first contact hole and the first conductive layer can be made larger by an amount corresponding to a difference between the widths of the first contact hole and the first conductive layer.

Further, with the construction of the first embodiment, the first and third conductive layers are electrically connected to each other via the second conductive layer having a larger width than that of the first conductive layer. As described before, it is not necessary to form a wide portion on the first conductive layer. The second insulation layer is interposed between the first and second conductive layers, and the first and second conductive layers can be formed to overlap each other. Therefore, when a plurality of first conductive layers are formed, the distance between the adjacent first conductive layers can be set to the smallest value which can be permitted in the manufacturing process. Further, since the second contact hole can be formed sufficiently large, the contact resistance of the second and third conductive layers can be reduced.

Thus, a contact portion of a semiconductor integrated circuit device can be obtained in which the contact resistance can be reduced without forming the wide portion in the signal line (first conductive layer), and a distance between the signal lines can be set small so as to enhance the integration density.

BRIEF DESCRIPTION OF THE DRAWINGS

FIG. 1A is a plan view showing the pattern of a contact portion of a semiconductor integrated circuit device according to a first embodiment of this invention;

FIG. 3 is a cross-sectional view of a contact portion of a semiconductor integrated circuit device according to a second embodiment.

DETAILED DESCRIPTION OF THE PREFERRED EMBODIMENTS

Figure 1B:
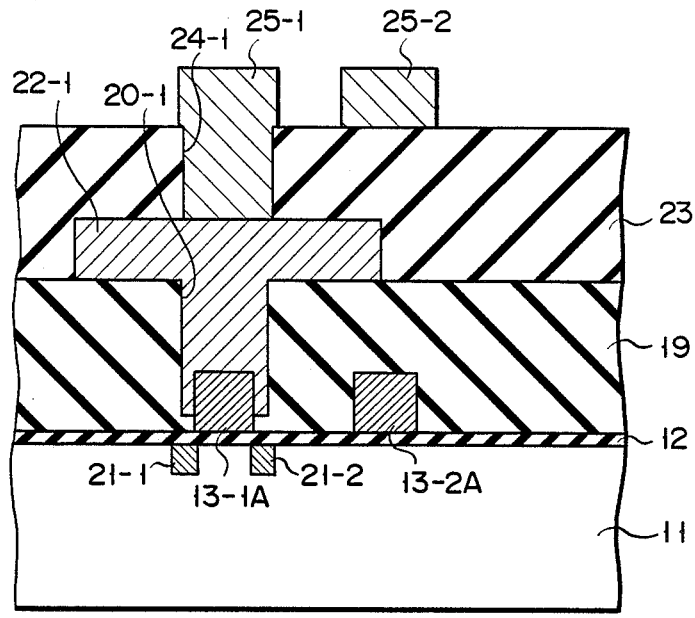
FIG. 1B is a cross-sectional view of the plan view of FIG. 1A, taken along line X—X'.
Figure 1C:
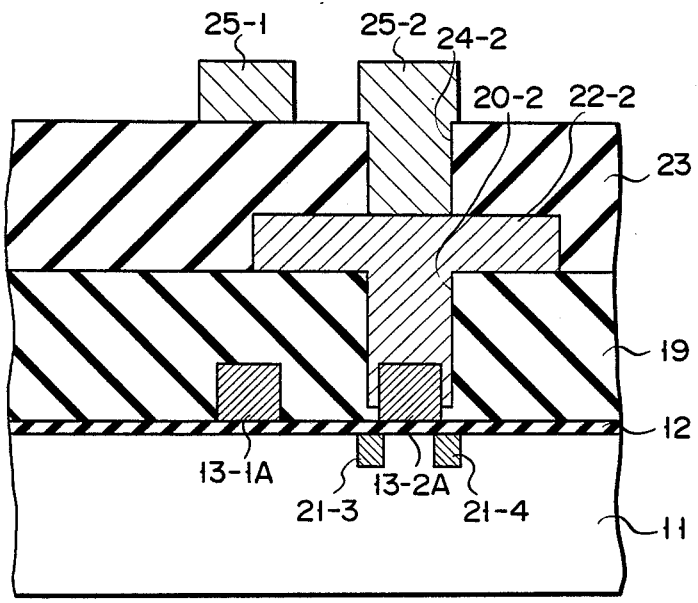
FIG. 1C is a cross-sectional view of the plan view of FIG. 1A, taken along line Y—Y'.

FIG. 1A is a plan view showing a main section of a memory cell of a semiconductor memory and a contact portion for connection between signal lines (word lines) formed so as to extend from the gate electrodes of cell switching MOSFETs in the memory cell, and conductive layers formed to reduce the contact resistance of the signal lines. FIG. 1B is a cross-sectional view of FIG. 1A, taken along line X—X', and FIG. 1C is a cross-sectional view of FIG. 1A, taken along line Y—Y'. Oxide film (first insulation layer) 12 is formed on semiconductor substrate 11, and signal lines (first conductive layers) 13-1A and 13-2A, extending from gates 13-1 and 13-2 of cell switching MOSFETs Q1 and Q2, are formed on oxide film 12. Signal lines 13-1A and 13-2A are formed of polycrystalline silicon and used as word lines. Diffusion regions 14-1 and 14-2, acting as the source and drain regions of MOSFET Q1, are formed in the main surface area of semiconductor substrate 11, on both sides of gate electrode 13-1. Likewise, diffusion regions 14-2 and 14-3, acting as the source and drain regions of MOSFET Q2, are formed in the main surface area of semiconductor substrate 11, on both sides of gate electrode 13-2. Diffusion region 14-2 is commonly used for MOSFETs Q1 and Q2. Diffusion region 15-1, used as one of the electrodes of capacitor C1, is formed in contact with diffusion region 14-1, in the main surface area of semiconductor substrate 11. Diffusion region 15-2, used as one of the electrodes of capacitor C2, is formed in contact with diffusion region 14-3, in the main surface area of semiconductor substrate 11. Plate electrode 16, used as the other electrodes of capacitors C1 and C2, is formed on an insulation film (not shown) formed on diffusion regions 15-1 and 15-2, and has a window 16A formed on areas of MOSFETs Q1 and Q2. Bit line 17 is formed on an insulation film (not shown) which is formed on plate electrode 16, and is formed so as to extend in a direction perpendicular to that of word lines 13-1A and 13-1B. In addition, bit line 17 is connected to diffusion region 14-2 via a contact hole 18.

CVD-SiO$_2$ film (second insulation film) 19 is formed on oxide film 12, and on word lines 13-1A and 13-2A. First contact holes 20-1 and 20-2 are formed in SiO$_2$ film 19, over word lines 13-1A and 13-2A, respectively, the widths of holes 20-1 and 20-2 being greater than those of lines 13-1A and 13-2A. Diffusion regions 21-1 and 21-2 are formed in the main surface area of semiconductor substrate 11, on both sides of word line 13-1A, and diffusion regions 21-3 and 21-4 are formed in the main surface area of semiconductor substrate 11, on both sides of word line 13-2A. Diffusion regions 21-1 to 21-4 are formed having a conductivity opposite to that of semiconductor substrate 11, and used to prevent semiconductor substrate 11 from being short-circuited with word lines 13-1A and 13-2A. That is, even in a case where SiO$_2$ film 19 is excessively etched to reach semiconductor substrate 11 at the time contact holes 20-1 and 20-2 are formed, polysilicon layers (second conductive layers) 22-1 and 22-2 are prevented from being connected to semiconductor substrate 11. Polysilicon layers 22-1 and 22-2 are formed in contact holes 20-1 and 20-2, on those portions of SiO$_2$ film 19 which lie around holes 20-1 and 20-2, and are formed having widths sufficiently greater than those of the contact holes. Layer 22-1 is additionally in contact with the upper and side surfaces of word line 13-1A, with layer 22-2 being in contact with the upper and side surfaces of word line 13-2A.

CVD-SiO$_2$ film (third insulation film) 23 is formed on the surface of the resultant structure, and second contact holes 24-1 and 2--2 are formed in portions of SiO$_2$ film 23 which lie on polysilicon layers 22-1 and 22-2. The widths of contact holes 24-1 and 24-2 are greater than those of word lines 13-1A and 13-2A but less than those of polysilicon layers 22-1 and 22-2. Aluminum wiring layers 25-1 and 25-2, for reducing the wiring resistance of word lines, are formed in contact holes 24-1 and 24-2 and on those portions of SiO$_2$ film 23 which lie around these holes. Aluminum wiring layers 25-1 and 25-2 are formed such that they extend along word lines 13-1A and 13-2A, with wiring layer 25-1 being connected to polysilicon layer 22-1 via contact hole 24-1, which is electrically connected to word line 13-1A via contact hole 20-1, and wiring layer 25-2 being connected to polysilicon layer 22-2 via contact hole 24-2, which is electrically connected to word line 13-2A via contact hole 20-2.

Although not shown in the drawing, a plurality of contact portions for connection between word lines 13-1A, 13-2A and aluminum wiring layers 25-1, 25-2 are provided on the same word line. Thus, word lines 13-1A and 13-2A having a large resistance are respectively connected in parallel with aluminum wiring layers 25-1 and 25-2, and therefore the wiring resistance can be reduced.

Figure 2A:
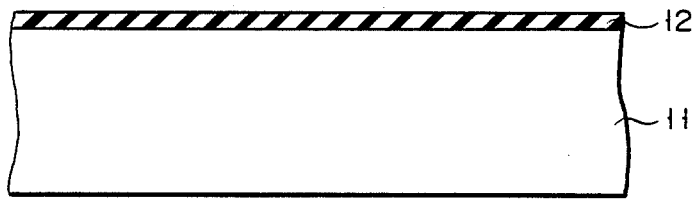
FIGS. 2A to 2E are cross-sectional views for illustrating the manufacturing process of the contact portion of the semiconductor integrated circuit device shown in FIG. 1B.
Figure 2B:
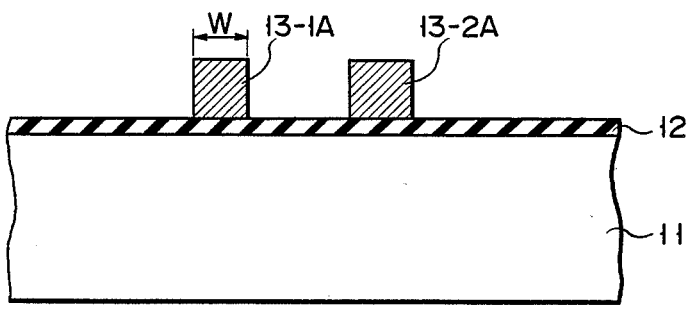
Figure 2C:
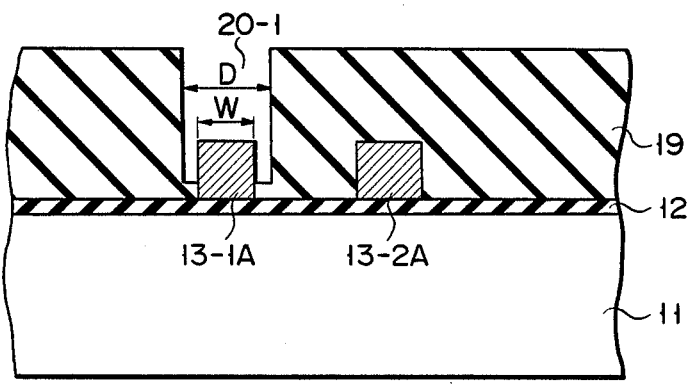

FIGS. 2A to 2E show the sequence of steps for manufacturing the contact portion shown in FIG. 1B. First, as is shown in FIG. 2A, oxide film 1 (gate oxide film) 12, having a thickness of approx. 150 Å, is formed on the main surface of P-type semiconductor substrate 11. Then, a polysilicon layer (approx. 4,000 Å thick) doped with phosphor is formed on oxide film 12. The polysilicon layer is subjected to a patterning process to form gate electrodes 13-1, 13-2 and word lines 13-1A, 13-2A which, as is shown in FIG. 2B, extend from gate electrodes 13-1, 13-2, and which, together with electrodes 13-1, 13-2, are formed having a width of, for example, 1 μm. Next, CVD-SiO₂ film 19, which is 3,000 to 4,000 Å thick, is formed by deposition on word lines 13-1A, 13-2A and oxide film 12. Thereafter, as is shown in FIG. 2C, first contact hole 20-1 is formed in SiO₂ film 19, at a position corresponding to word line 13-1A, and has a width D which is greater than width W of word line 13-1A, and is formed such that it does not reach substrate 11.

Figure 2D:
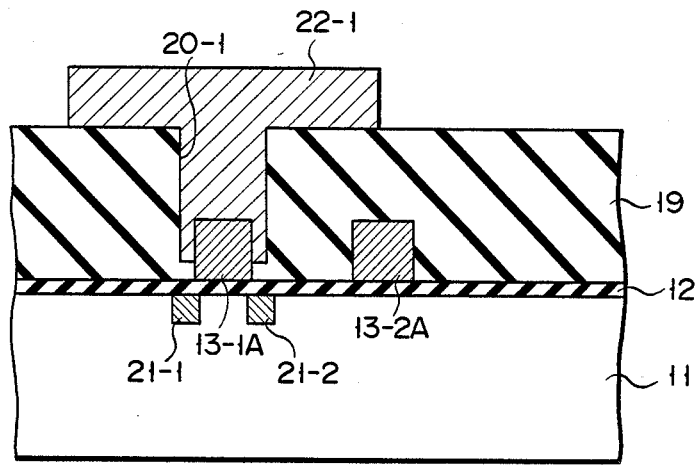

Then, phosphor is ion-implanted into the main surface area of semiconductor substrate 11, with SiO₂ film 19, having contact hole 20-1, and word line 13-1A serving as a mask, to form N-type diffusion regions 21-1 and 21-2. After this, a polysilicon layer doped with phosphor as impurity is formed on the surface of the resultant structure, thus filling contact hole 20-1 and being formed such that it contacts the upper and side surfaces of word line 13-1A and is electrically connected thereto. Then, as is shown in FIG. 2D, the polysilicon layer is subjected to a patterning process to form polysilicon pattern 22-1, which has a width greater than that of contact hole 20-1.

Figure 2E:
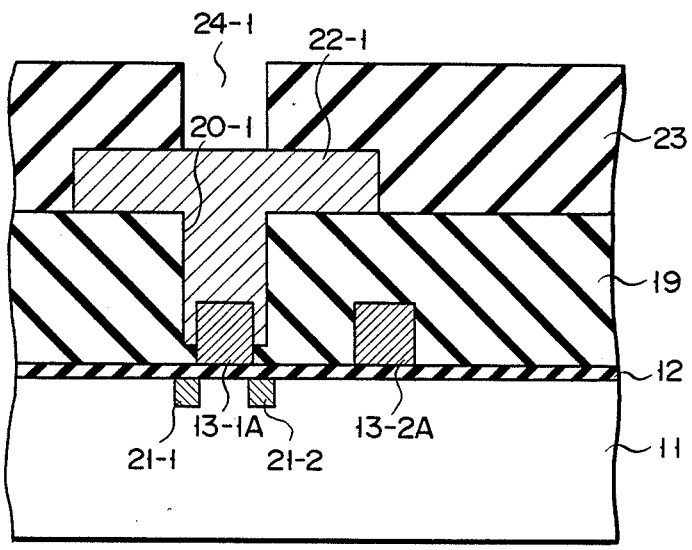

Thereafter, as is shown in FIG. 2E, CVD-SiO₂ film 23, having a thickness of 3,000 to 4,000 Å, is formed by deposition on the surface of polysilicon pattern 22-1 and CVD-SiO₂ film 19. Second contact hole 24-1 is then formed in SiO₂ film 23 lying on polysilicon pattern 22-1, such that it has a width greater than width W of word line 13-1A but less than that of polysilicon pattern 22-1. After this, an aluminum layer is formed, by use of a sputtering method, on SiO₂ film 23 and in contact hole 24-1, as a result of which the layer is electrically connected to polysilicon layer 22-1. Then, the aluminum layer is subjected to a patterning process to form aluminum wiring layers 25-1 and 25-2, thus providing a contact portion as is shown in FIG. 1B.

As a result of being constructed as described above, polysilicon layer (polysilicon pattern) 22-1 and polysilicon layer 22-2 are formed in contact with the upper and side surfaces of word lines 13-1A and 13-2A, respectively. Therefore, large contact areas are attained therebetween, and thus their contact resistance can be reduced. In addition, the margin or tolerance of mask alignment for word lines 13-1A and 13-2A, at the time of forming contact holes 20-1 and 20-2, can be determined by a difference "D-W" between width D of contact holes 20-1 and 20-2 and width W of word lines 13-1A and 13-2A. Since aluminum wiring layers 25-1 and 25-2, which are formed as upper layers, are electrically connected to word lines 13-1A and 13-2A formed as lower layers, respectively, via polysilicon layers 22-1 and 22-2 formed between CVD-SiO₂ films 19 and 23, it is therefore not necessary to form wide portions in word lines 13-1A and 13-2A. Further, since polysilicon layers 22-1, 22-2 and word lines 13-1A and 13-2A can be formed such that they overlap each other, the distance between word lines 13-1A and 13-2A can be set to the smallest value which can be permitted in the manufacturing process. Since second contact holes 22-1 and 22-2 can be formed sufficiently large, the contact resistance between polysilicon layers 22-1, 22-2 and aluminum wiring layers 25-1, 25-2 can also be reduced. Thus, small contact resistances can be obtained between word lines 13-1A, 13-2A and aluminum wiring layers 25-1, 25-2.

FIG. 3 shows a contact portion of a semiconductor integrated circuit device according to a second embodiment of this invention. The same portions in FIG. 3 as those in FIGS. 1A and 1B are denoted by the same reference numerals. Oxide film (first insulation layer) 12 is formed on semiconductor substrate 11, and word lines 13-1A and 13-2A which are formed, for example, to extend from the gate electrodes of cell switching MOSFETs Q1 and Q2 are formed on oxide film 12. CVD-SiO₂ film (second insulation layer) 19 is formed on oxide film 12 and word lines 13-1A and 13-2A. Contact hole 20-1 is formed in SiO₂ film 19 in position corresponding to word line 13-1A. Contact hole 20-1 is formed wider than word line 13-1A. Diffusion regions 21-1 and 21-2 are formed in the main surface area of semiconductor substrate 11 on both sides of word line 13-1A. Diffusion regions 21-1 and 21-2 are formed with a conductivity type opposite to that of semiconductor substrate 11 and are used to prevent semiconductor substrate 11 from being electrically connected to conductive layer 26. CVD-SiO₂ film 19 is formed on word lines 13-1A and 13-2A and oxide film 12. Contact hole 20-1 is formed in SiO₂ film 19 in position corresponding to word line 13-1A. Conductive layer 26 which is formed of a metal layer such as aluminum, silicide layer or polysilicon layer and has a low resistance is formed to fill contact hole 20-1. Further, conductive layer 26 is formed to extend along word line 13-1A.

With this construction, since conductive layer 26 is formed in contact with the upper and side surfaces of word line 13-1A, the contact resistance can be reduced. Thus, the contact resistance can be reduced without forming a wide portion in the signal line and the word lines can be closely arranged.

In the first and second embodiments described above, the word line is used as the signal line. However, the signal line is not limited to the word line and can be applied to other types of signal lines. Further, diffusion regions 21-1 and 21-2 are formed after formation of contact holes 20-1 and 20-2 in order to prevent a short circuit between polysilicon layers 22-1, 22-2 and semiconductor substrate 11 which may occur in a case where SiO₂ film 19 is excessively etched at the time of formation of contact holes 20-1 and 20-2 and contact holes 20-1 and 20-2 have reached semiconductor substrate 11. However, diffusion regions 21-1 and 21-2 may be formed before formation of contact holes 20-1 and 20-2. Further, oxide film 12 is formed of the gate oxide film, but it can be formed of a field oxide film with a thickness of approx. 4,000 Å. Phosphor is doped into word lines 13-1A, 13-2A and polysilicon layers 22-1, 22-2, but the same effect can be attained by using arsenic. Further, word lines 13-1A and 13-2A are formed of polycrystalline silicon, but can be formed of silicide. Likewise, silicide layers can be used instead of polysilicon layers 22-1 and 22-2 formed between word lines 13-1A, 13-2A and aluminum wiring layers 25-1, 25-2.

As described above, according to this invention, a semiconductor device can be provided in which the contact resistance can be reduced without forming a wide portion in the signal line, and signal lines can be closely arranged to enhance the integration density.

What is claimed is:

1. A contact portion of a semiconductor integrated circuit device comprising:
   a semiconductor substrate;
   a first insulation layer formed on said semiconductor substrate;
   a first conductive layer formed on said first insulation layer;

a second insulation layer, formed on said first conductive layer and said first insulation layer;

a first contact hole formed in a portion of said second insulation layer which is located over said first conductive layer, said first contact hole having a width greater than that of said first conductive layer and a depth less than the thickness of said second insulation layer, with the depth of said first contact hole being greater than a value obtained by subtracting the thickness of said first conductive layer from that of said second insulation layer;

a second conductive layer, having a width greater than that of said first contact hole, and formed on said second insulation layer and in said first contact hole, so as to be in contact with upper and side surfaces of said first conductive layer located inside said first contact hole;

a third insulation layer, formed on said second conductive layer and said second insulation layer;

a second contact hole, having a width less than that of said second conductive layer, and formed in said third insulation layer, at a position corresponding to said second conductive layer; and a third conductive layer, formed on said third insulation layer and in said second contact hole.

2. A contact portion according to claim 1, wherein said first conductive layer is formed so as to extend from a gate electrode of a MOSFET.

3. A contact portion according to claim 2, wherein said first conductive layer includes a word line.

4. A contact portion according to claim 1, further comprising at least one diffusion region formed having a conductivity opposite to that of said semiconductor substrate, and formed in the surface area of said semiconductor substrate, below said first contact hole, to prevent a short circuit between said semiconductor substrate and said first conductive layer.

5. A contact portion according to claim 1, wherein at least one of said first and second conductive layers includes a polysilicon layer doped with an impurity.

6. A contact portion according to claim 5, wherein said impurity is selected from a group consisting of phosphor and arsenic.

7. A contact portion according to claim 1, wherein at least one of said first and second conductive layers includes a silicide.

8. A contact portion according to claim 1, wherein said second contact hole is formed so as to have a width greater than that of said first conductive layer.

9. A contact portion according to claim 1, wherein said third conductive layer has a width less than that of said second conductive layer.

10. A contact portion according to claim 1, wherein said third conductive layer includes aluminum.

11. A contact portion of a semiconductor integrated circuit device comprising:
a semiconductor substrate;
a first insulation layer formed on said semiconductor substrate;
a first conductive layer formed on said first insulation layer;
a second insulation layer, formed on said conductive layer and said first insulation layer;
a first contact hole formed in a portion of said second insulation layer which is located over said first conductive layer, said first contact hole having a width greater than that of said first conductive layer and a depth less than the thickness of said second insulation layer, with the depth of said first contact hole being greater than a value obtained by subtracting the thickness of said first conductive layer from that of said second insulation layer; and
a second conductive layer, formed on said second insulation layer and in said first contact hole, so as to be in contact with upper and side surfaces of said first conductive layer located inside said first contact hole.

12. A contact portion according to claim 11, wherein said first conductive layer is formed so as to extend from a gate electrode of a MOSFET.

13. A contact portion according to claim 12, wherein said first conductive layer includes a word line.

14. A contact portion according to claim 11, further comprising at least one diffusion region formed having a conductivity opposite to that of said semiconductor substrate, and formed in the surface area of said semiconductor substrate, below said first contact hole, to prevent a short circuit between said semiconductor substrate and said first conductive layer.

15. A contact portion according to claim 11, wherein at least one of said first and second conductive layers includes a polysilicon layer doped with an impurity.

16. A contact portion according to claim 15, wherein said impurity is selected from a group consisting of phosphor and arsenic.

17. A contact portion according to claim 11, wherein at least one of said first and second conductive layers includes a silicide.

18. A contact portion according to claim 11, wherein said second conductive layer is formed so as to have a width greater than that of said first contact hole.

19. A contact portion according to claim 11, wherein said second conductive layer includes aluminum.

* * * * *